(12) United States Patent
Kim

(10) Patent No.: US 9,627,033 B2
(45) Date of Patent: Apr. 18, 2017

(54) SENSE AMPLIFIER AND SEMICONDUCTOR DEVICE FOR SECURING OPERATION MARGIN OF SENSE AMPLIFIER

(71) Applicant: SK hynix Inc., Icheon-si Gyeonggi-do (KR)

(72) Inventor: Dong Keun Kim, Icheon-si Gyeonggi-do (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/817,657

(22) Filed: Aug. 4, 2015

(65) Prior Publication Data

US 2016/0307618 A1    Oct. 20, 2016

(30) Foreign Application Priority Data

Apr. 20, 2015    (KR) .................. 10-2015-0055447

(51) Int. Cl.

| | |
|---|---|
| *G11C 7/10* | (2006.01) |
| *G11C 11/4091* | (2006.01) |
| *G11C 11/4076* | (2006.01) |
| *G11C 11/4094* | (2006.01) |
| *G11C 11/4093* | (2006.01) |
| G11C 7/06 | (2006.01) |
| G11C 7/08 | (2006.01) |

(52) U.S. Cl.
CPC ...... *G11C 11/4091* (2013.01); *G11C 11/4076* (2013.01); *G11C 11/4093* (2013.01); *G11C 11/4094* (2013.01); G11C 7/065 (2013.01); G11C 7/08 (2013.01)

(58) Field of Classification Search
None
See application file for complete search history.

(56) References Cited

U.S. PATENT DOCUMENTS

| 7,505,343 | B2 | 3/2009 | Kang | |
|---|---|---|---|---|
| 8,194,484 | B2* | 6/2012 | Lee | G11C 11/4094 365/149 |
| 2002/0176302 | A1* | 11/2002 | Jung | G11C 7/12 365/222 |
| 2008/0205177 | A1* | 8/2008 | Kim | G11C 5/063 365/205 |
| 2009/0147604 | A1* | 6/2009 | Kang | G11C 11/4091 365/205 |
| 2011/0075491 | A1* | 3/2011 | Yun | G11O 5/147 365/189.11 |
| 2016/0012868 | A1* | 1/2016 | Moon | G11C 7/12 365/189.11 |

FOREIGN PATENT DOCUMENTS

KR    100483026 B1    4/2005

* cited by examiner

*Primary Examiner* — Harry W Byrne
*Assistant Examiner* — Sultana Begum
(74) *Attorney, Agent, or Firm* — William Park & Associates Ltd.

(57) ABSTRACT

A sense amplifier includes an equalization unit configured to precharge a pair of bit lines to a level of a bit line precharge voltage in response to a bit line equalizing signal; and an amplification unit configured to sense and amplify voltages of the pair of bit lines, supply, during an active operation, a ground voltage to a pull-down node of a latch section, and supply, when a precharge signal is enabled, a first voltage lower than the ground voltage to the pull-down node of the latch section for a predetermined time.

15 Claims, 7 Drawing Sheets

SENSE AMPLIFIER AND SEMICONDUCTOR DEVICE FOR SECURING OPERATION MARGIN OF SENSE AMPLIFIER

CROSS-REFERENCES TO RELATED APPLICATION

The present application claims priority under 35 U.S.C. §119(a) to Korean application number 10-2015-0055447 filed on Apr. 20, 2015, in the Korean Intellectual Property Office, which is incorporated herein by reference in its entirety.

BACKGROUND

1. Technical Field

Various embodiments generally relate to a sense amplifier and a semiconductor device including the same, and more particularly to a technology for securing the operation margin of a sense amplifier.

2. Related Art

Recent developments in electronic systems are leading to advances in highly integrated high-speed semiconductor memory devices. In order to increase the operating speeds of the semiconductor memory devices, a synchronous memory device has been developed. This synchronous memory device is a device that has an interface being synchronized with a system clock.

A single data rate (hereinafter, referred to as "SDR") synchronous memory device usually refers to a synchronous memory device in which only one word of data is transmitted per clock cycle. In the SDR synchronous memory device, for example, the input and output of the data is in synchronization with the rising edge of a clock signal.

The next generation of synchronous memory device is double data rate (hereinafter, referred to as "DDR") synchronous memory device. A DDR synchronous memory device usually refers to a synchronous memory device that reads or writes two words of data per clock cycle. The interface technology of the DDR synchronous memory device may be accomplished by reading and writing data on both the rising and falling edges of the clock signal.

This allows a doubling of bandwidth without having to change the frequency of the clock signal.

Among various semiconductor memory devices, a dynamic random access memory (hereinafter, referred to as "DRAM") is a representative volatile memory. The memory cell of the DRAM may include a cell transistor and a cell capacitor.

The cell transistor allows a memory controller to control an access to the cell capacitor, which stores charges corresponding to data. That is to say, according to the amount of the charges stored in the cell capacitor, a sense amplifier may sense the amount of the charges to determine what the charges stored in the cell capacitor represent between a logic-high level and a logic-low level. If a word line is enabled in a semiconductor memory device, charge sharing occurs between a bit line and a bit line bar, and then the sense amplifier operates.

FIG. 1 illustrates that a logic-low data stored in a cell is driven by a pull-down control signal after a charge-sharing operation started. A sense amplifier senses the logic-low data of the cell through a pair of bit lines BL and BLB when a word line WL is enabled. FIG. 2 illustrates that a logic-high data stored in the cell is driven by a pull-up control signal after a charge-sharing operation started. The sense amplifier senses the logic-high data of the cell through the pair of bit lines BL and BLB when the word line WL is enabled.

However, continued advances in highly integrated DRAM are leading to a reduction in cell area, which may cause a decrease in capacitance of cell capacitors. As a consequence, a sensing margin Delta V may decrease as shown in FIGS. 1 and 2.

SUMMARY

Various embodiments are directed to controlling the driving voltage of a sense amplifier and securing an operation margin.

In an embodiment, a sense amplifier may include: an equalization unit configured to precharge a pair of bit lines to a level of a bit line precharge voltage in correspondence to a bit line equalizing signal; and an amplification unit configured to sense and amplify voltages of the pair of bit lines, supply a ground voltage to a pull-down node in an active operation, and supply a first voltage lower than the ground voltage to the pull-down node for a predetermined time when a precharge signal is enabled.

In an embodiment, a semiconductor device may include: a sense amplifier configured to precharge a pair of bit lines to a level of a bit line precharge voltage in correspondence to a bit line equalizing signal, and sense and amplify data of the pair of bit lines in correspondence to driving voltages applied to a pull-up power line and a pull-down power line; and a sense amplifier control circuit configured to supply a core voltage to the pull-up power line in correspondence to a pull-up driving signal, and supply a minus voltage lower than a ground voltage to the pull-down power line for a predetermined time in correspondence to a pull-down driving signal when a precharge signal is enabled.

According to the embodiments, since it is possible to secure the operation margin of a sense amplifier, the manufacturing yield of a semiconductor device may be increased and a chip size may be decreased.

DETAILED DESCRIPTION

Hereinafter, a sense amplifier and a semiconductor device including the same will be described below with reference to the accompanying drawings through various examples of embodiments.

The data stored in a semiconductor device in accordance with an embodiment is identified as a high level (H) or a low level (L) in correspondence to a voltage level, and is expressed as '1' or '0'. A data value is differently identified according to a voltage level and a current magnitude. In the case of binary data, a high level is defined as a high voltage, and a low level is defined as a low voltage lower than the high level.

Figure 1:
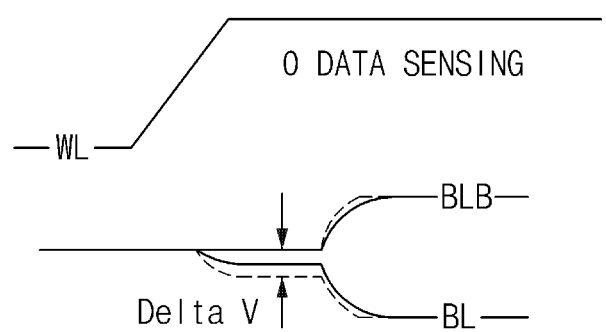
FIGS. 1 and 2 are diagrams to explain a sensing operation of a known sense amplifier.
Figure 2:
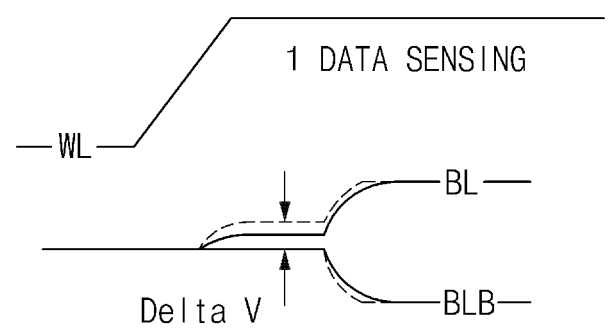
Figure 3:
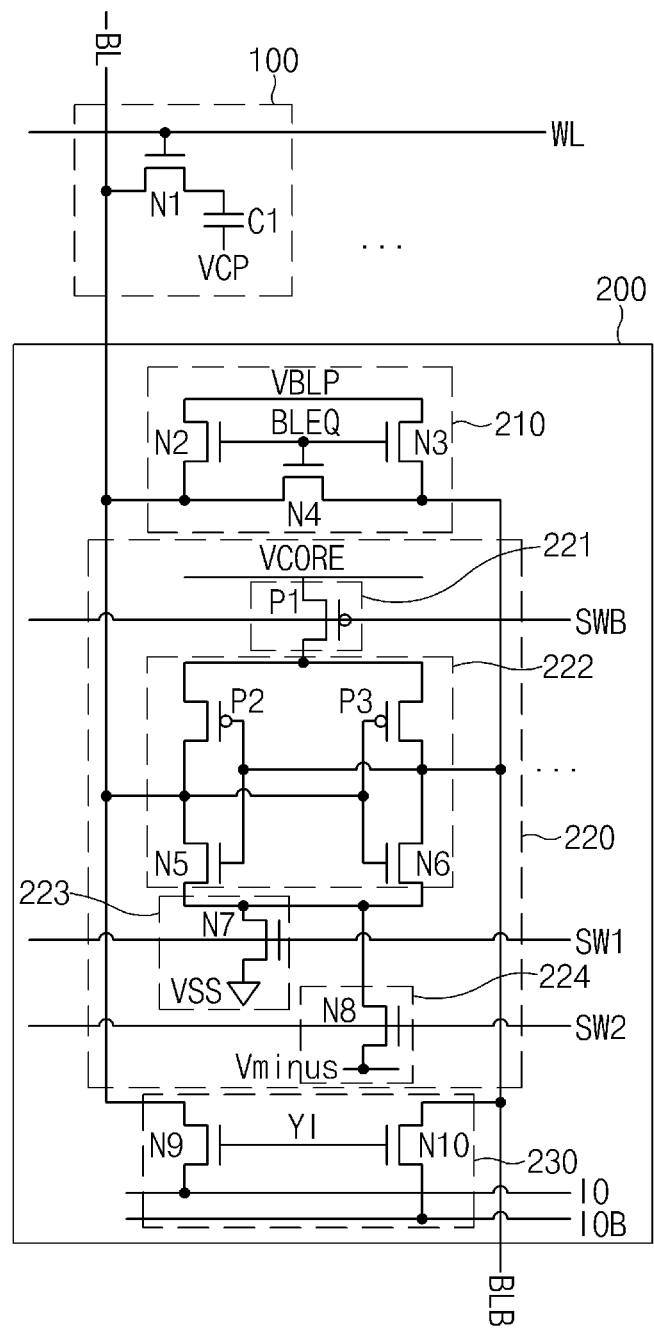
FIG. 3 is a configuration diagram illustrating an example of a memory cell and a sense amplifier in accordance with an embodiment.

FIG. 3 is a configuration diagram illustrating an example of a memory cell 100 and a sense amplifier 200 in accordance with an embodiment.

The memory cell 100 may store charges therein and, if the memory cell 100 is storing charges, provide the charges to a bit line BL coupled to the memory cell 100. The memory cell 100, which include an NMOS transistor N1 and a capacitor C1, may be coupled to a word line WL through which the memory cell 100 may be selected. The NMOS transistor N1 is coupled between the bit line BL and the capacitor C1, and has a gate terminal which is coupled to the word line WL. The capacitor C1, which is coupled between the NMOS transistor N1 and a terminal to which a cell plate voltage VCP applies, may store data.

When the word line WL is enabled, the memory cell 100 stores the data applied from a pair of bit lines BL and BLB or outputs stored data to the sense amplifier 200 through the pair of bit lines BL and BLB.

A unit cell (e.g., the memory cell 100) includes a switching element (e.g., N1) and a capacitor (e.g., C1). The switching element, which is coupled between the bit line BL and the capacitor, may be turned-on in response to a signal (e.g., a logic-high signal) applied to the word line WL. The capacitor, which is coupled between a terminal of a cell plate voltage and the switching element, may store data.

The sense amplifier 200 may include an equalization unit 210, an amplification unit 220, and a column selection unit 230.

The equalization unit 210 precharges the pair of bit lines BL and BLB to the level of a bit line precharge voltage VBLP in response to a bit line equalizing signal BLEQ. The bit line precharge voltage VBLP may be a voltage corresponding to (VCORE/2)–Vminus. That is to say, the bit line precharge voltage VBLP may be a voltage lower by a minus voltage Vminus than one half of a core voltage VCORE.

The equalization unit 210 may include a plurality of NMOS transistors N2 to N4. The gate terminals of the plurality of NMOS transistors N2 to N4 are coupled in common to a terminal to which the bit line equalizing signal BLEQ is applied. The NMOS transistors N2 and N3 are coupled between a terminal to which the bit line precharge voltage VBLP is applied and the pair of bit lines BL and BLB, respectively. The source/drain terminals of the NMOS transistor N4 are coupled to the pair of bit lines BL and BLB, respectively.

The amplification unit 220 may include a pull-up section 221, a latch section 222 and pull-down sections 223 and 224, and may amplify voltage signals transmitted through the pair of bit lines BL and BLB.

The pull-up section 221 may supply the core voltage VCORE to the latch section 222 in response to a driving signal SWB. The pull-up section 221 may include a PMOS transistor P1. The PMOS transistor P1 may be coupled between the latch section 222 and a terminal through which the core voltage VCORE is transmitted, and may be applied with the driving signal SWB through the gate terminal thereof.

The latch section 222 amplifies the data transmitted through the pair of bit lines BL and BLB. The latch section 222 may include PMOS transistors P2 and P3 and NMOS transistors N5 and N6 forming a latch structure. The gate terminals of the PMOS transistor P2 and the NMOS transistor N5 are coupled to the bit line bar BLB in common.

The gate terminals of the PMOS transistor P3 and the NMOS transistor N6 are coupled to the bit line BL in common.

The pull-down section 223 is controlled by a driving signal SW1, and pulls the voltage level of the latch section 222 down to the level of a ground voltage VSS. The pull-down section 223 may include an NMOS transistor N7 which is coupled between a pull-down node of the latch section 222 and a terminal through which the ground voltage VSS is applied, and may be applied with the driving signal SW1 through the gate terminal thereof. The pull-down section 223 is turned on if the driving signal SW1 is enabled at a time when the amplification unit 220 operates, and supplies the ground voltage VSS to the latch section 222.

The pull-down section 224 is controlled by a driving signal SW2, and pulls the voltage level of the latch section 222 down to the level of the minus voltage Vminus. In an embodiment, the minus voltage Vminus has a negative voltage level lower than the ground voltage VSS. The pull-down section 224 may include an NMOS transistor N8 which is coupled between the latch section 222 and a terminal through which the minus voltage Vminus is applied, and may be applied with the driving signal SW2 through the gate terminal thereof.

The pull-down section 224 is turned on and supplies the minus voltage Vminus to the latch section 222 when the driving signal SW1 is disabled and the pull-down section 223 is turned off. In other words, in order to additionally secure an operation voltage of the bit line sense amplifier 200, the minus voltage Vminus is supplied to the latch section 222.

In the case where the minus voltage Vminus is supplied as the driving voltage of the sense amplifier 200, an abrupt current loss may be induced. Thus, the ground voltage VSS is supplied during active, write and read operation periods, and the minus voltage Vminus is supplied by a precharge command before the pair of bit lines BL and BLB are equalized. After a signal being outputted from the memory cell 100 is amplified and stored in the latch section 222, an equalization operation for the pair of bit lines BL and BLB is performed.

The pull-down section 224 is turned off if the driving signal SW2 is disabled at a time when the amplification unit 220 is disabled.

The column selection unit 230 selectively controls electrically coupling of the pair of bit lines BL and BLB and a pair of input/output lines IO and IOB in response to a column select signal YI. The column selection unit 230 may include NMOS transistors N9 and N10 which are coupled between the pair of bit lines BL and BLB and the pair of input/output lines IO and IOB, and may be applied with the column select signal YI through the common gate terminal thereof.

Figure 4:
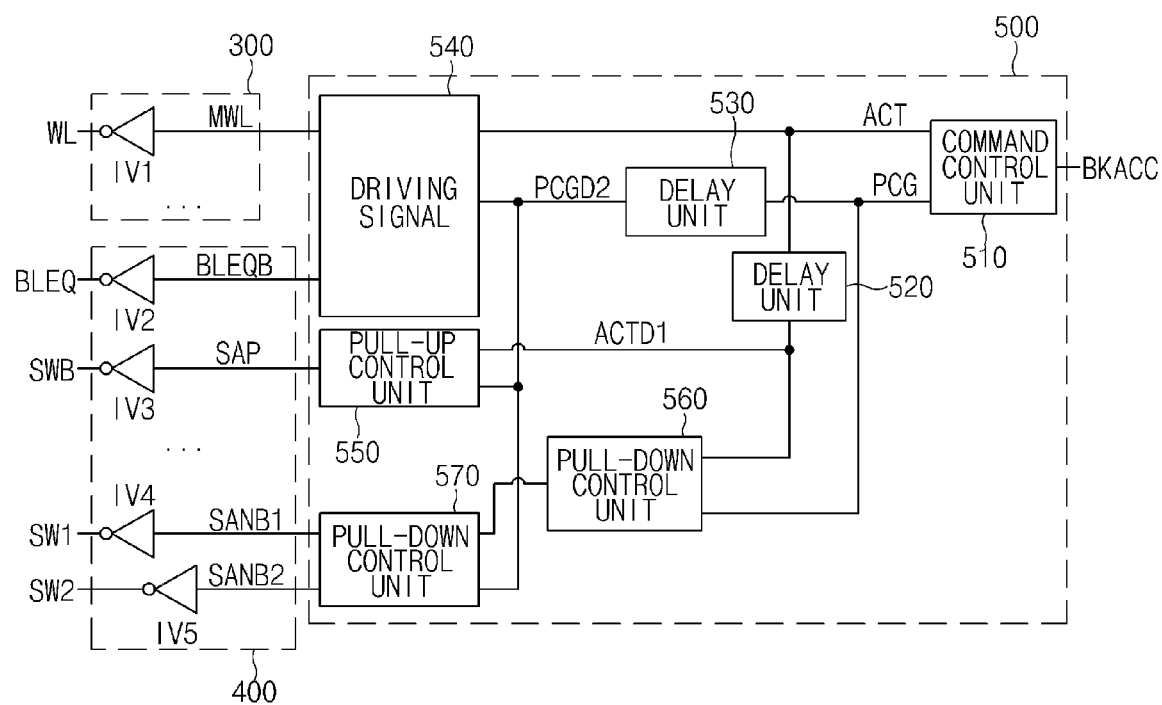
FIG. 4 is a detailed configuration diagram illustrating an example of a driving signal control circuit for driving the sense amplifier shown in FIG. 3.

FIG. 4 is a detailed configuration diagram illustrating an example of a driving signal control circuit for driving the sense amplifier 200 shown in FIG. 3.

The driving signal control circuit may include a word line driving block 300, a sense amplifier driving block 400, and a bank control block 500. The sense amplifier driving block 400 may be formed in a repeater region. The bank control block 500 may include a command control unit 510, delay units 520 and 530, a driving signal generation unit 540, a pull-up control unit 550, and pull-down control units 560 and 570.

The word line driving block 300 may include an inverter IV1, which drives a signal transmitted through a main word line MWL, and output a resultant signal to the word line WL. While the embodiment illustrates only one inverter IV1 which operates as a driving block, it is to be noted that the word line driving block 300 may include a plurality of inverters.

The sense amplifier driving block 400 may include a plurality of inverters IV2 to IV5. The inverter IV2 drives a bit line equalizing signal BLEQB, and outputs a bit line equalizing signal BLEQ to the equalization unit 210. The inverter IV3 drives a pull-up driving signal SAP, and outputs a driving signal SWB to the pull-up section 221. The inverter IV4 drives a pull-down driving signal SANB1, and outputs a driving signal SW1 to the pull-down section 223. The inverter IV5 drives a pull-down driving signal SANB2, and outputs the driving signal SW2 to the pull-down section 224.

While the embodiment illustrates only one of each of the inverters IV2 to IV5 which operate as a driving block, it is to be noted that the sense amplifier driving block 400 may be realized by a plurality of inverter chains.

The command control unit 510 generates an active signal ACT and a precharge signal PCG in response to a bank control signal BKACC. The bank control signal BKACC is a bank access signal which is enabled by an external active command and is disabled by an external precharge command.

The delay unit 520 delays the active signal ACT by a predetermined time, and outputs an active delay signal ACTD1 to the pull-up control unit 550 and the pull-down control unit 560. The delay unit 530 delays the precharge signal PCG by a predetermined time, and outputs a precharge delay signal PCGD2 to the driving signal generation unit 540, the pull-up control unit 550 and the pull-down control unit 570.

The driving signal generation unit 540 generates a signal to transmit it though the main word line MWL and the bit line equalizing signal BLEQB in response to the active signal ACT and the precharge delay signal PCGD2. The pull-up control unit 550 outputs the pull-up driving signal SAP in response to the active delay signal ACTD1 and the precharge delay signal PCGD2.

The pull-down control unit 560 outputs a signal for controlling a pull-down operation, to the pull-down control unit 570, in response to the active delay signal ACTD1 and the precharge signal PCG. The pull-down control unit 570 generates the pull-down driving signals SANB1 and SANB2 for controlling pull-down operations in response to the precharge delay signal PCGD2 and the output signal of the pull-down control unit 560.

In an embodiment, the pull-down control unit 560 first controls the driving signals SW1 and SW2 by being inputted with the precharge signal PCG not having passed through delay means. Further, after the precharge signal PCG is enabled and is delayed by a delay time of the delay unit 530, the driving signal generation unit 540 and the pull-up control unit 550 control the signal of the word line WL, the bit line equalizing signal BLEQ and the driving signal SWB.

Figure 5:
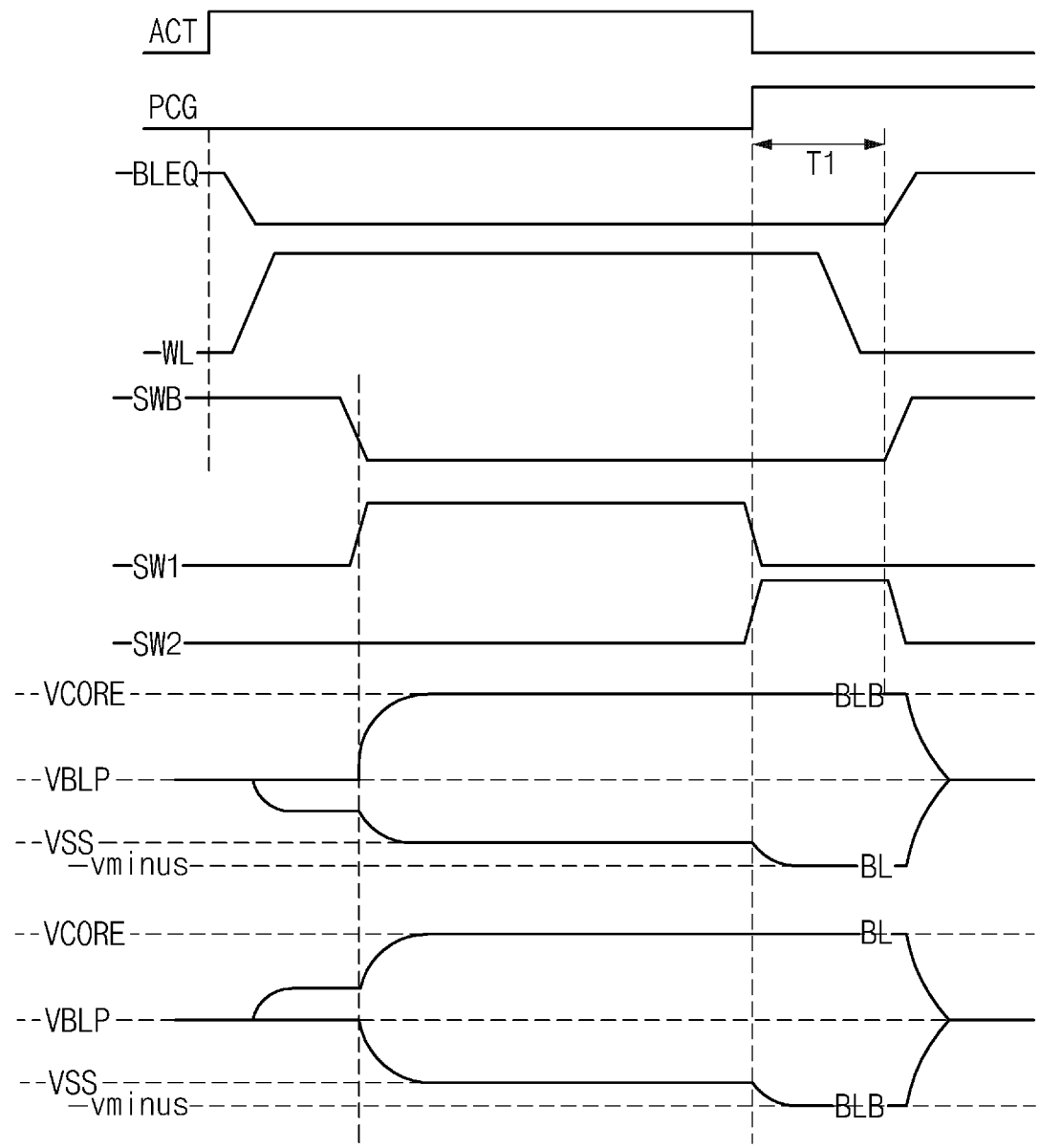
FIG. 5 is a timing diagram to explain the operation of the sense amplifier shown in FIG. 3.

FIG. 5 is a timing diagram to explain the operation process of the sense amplifier 200 shown in FIG. 3.

In the case where the active signal ACT is enabled to a high level, the driving signal generation unit 540 outputs the bit line equalizing signal BLEQB having a high level and outputs a signal having a low level to the main word line MWL.

Then, the signal of the word line WL which is outputted from the word line driving block 300 transitions to a high level, and the bit line equalizing signal BLEQ becomes a low level. The charges stored in the cell 100 are transferred to the bit line BL, and the equalization unit 210 becomes a turned-off state.

After the delay time of the delay unit 520, the driving signal SWB is disabled and the driving signal SW1 is enabled. The delay unit 520 has the delay time until a sensing margin voltage Delta V of the sense amplifier 200 is secured.

That is to say, in the case where the driving signal SWB is a high level and the driving signals SW1 and SW2 are low levels, the sense amplifier 200 does not operate. In the case where the sense amplifier 200 is in a precharge state, the sense amplifier 200 precharges bit lines with the bit line precharge voltage VBLP. If the word line WL is enabled, the pair of bit lines BL and BLB start to develop due to the difference between the voltages applied to the pair of bit lines BL and BLB.

The delay unit 520 delays the active signal ACT, and enables the active delay signal ACTD1 after the delay time. The pull-up control unit 550 enables the pull-up driving signal SAP in response to the active delay signal ACTD1. If the driving signal SWB becomes a low level, the pull-up section 221 is turned on, and the amplification unit 220 operates. If the pull-up section 221 is turned on, the core voltage VCORE is supplied to the latch section 222.

If the active delay signal ACTD1 is enabled, the pull-down driving signal SANB1 is first enabled to a low level by the operations of the pull-down control units 560 and 570. Also, the driving signal SW1 transitions to a high level by the sense amplifier driving block 400.

In the case where the driving signal SW1 is the high level, the pull-down section 223 is turned on, and the ground voltage VSS is supplied to the latch section 222. In other words, the ground voltage VSS is supplied as a pull-down voltage to the latch section 222 during a period in which the driving signal SW1 is the high level.

The pull-down control unit 570 enables the pull-down driving signal SANB2 to a low level after a predetermined delay time has passed from when the pull-down driving signal SANB1 is enabled to the low level. The driving signal SW2 retains the low level during a period in which the driving signal SW1 is the high level.

Thereafter, if the bank control signal BKACC is disabled and the precharge signal PCG is enabled, the pull-down control units 560 and 570 disable the pull-down driving signal SANB1 to a high level. Then, the driving signal SW1 is disabled to the low level by the sense amplifier driving block 400. When the pull-down section 223 is turned off, the ground voltage VSS is not supplied any more to the latch section 222.

If the precharge signal PCG is enabled to a high level, the pull-down control units 560 and 570 make the pull-down driving signal SANB2 transition to the low level. Then, the driving signal SW2 transitions to a high level by the sense amplifier driving block 400.

When the pull-down section 224 is turned on during a period in which the driving signal SW2 is the high level, the minus voltage Vminus is supplied to the latch section 222. In an embodiment, during a specified period (e.g., a period T1) from the enable time of the precharge signal PCG, a sensing margin Delta V of the sense amplifier 200 may be increased, whereby it is possible to secure the sensing margin Delta V of the sense amplifier 200.

The pull-down section 224 supplies the minus voltage Vminus to the latch section 222 during the period (e.g., the period T1) from when the precharge signal PCG is enabled to the high level to before the bit line equalizing signal BLEQ is enabled to a high level. A time during which the driving signal SW2 is enabled and the pull-down section 224 supplies the minus voltage Vminus may be set as the delay time of the delay unit 530.

If the active signal ACT transitions to a low level, the driving signal generation unit 540 outputs a signal having a high level to the main word line MWL. Then, the word line driving block 300 makes a signal being outputted from the word line WL transition to a low level. When the NMOS transistor N1 of the cell 100 is turned off, the charges of the cell 100 are not transferred any more to the bit line BL.

After the precharge signal PCG is enabled to the high level, if the delay time of the delay unit 530 has passed, the precharge delay signal PCGD2 is enabled. Then, the driving signal generation unit 540 makes the bit line equalizing signal BLEQB transition to a low level.

The bit line equalizing signal BLEQ transitions to the high level by the sense amplifier driving block 400. When the equalization unit 210 is turned on, the pair of bit lines BL and BLB are equalized to the level of the bit line precharge voltage VBLP.

If the precharge delay signal PCGD2 is enabled, the pull-up control unit 550 transitions the pull-up driving signal SAP to a low level. The sense amplifier driving block 400 transitions and outputs the driving signal SWB to the high level. Then, the pull-up section 221 is turned off, and the sense amplifier 200 does not operate.

If the precharge delay signal PCGD2 is enabled, the pull-down control unit 570 transitions the pull-down driving signal SANB2 to the high level. The sense amplifier driving block 400 transitions the driving signal SW2 to the low level. Then, as the pull-down section 224 is turned off, the minus voltage Vminus is not supplied any more to the latch section 222.

In an embodiment, the minus voltage Vminus is supplied to the sense amplifier 200 during an enable period (e.g., the period T1) of the driving signal SW2, and thus an amplified voltage signal may be stored in a memory cell. As a consequence, a sensing margin for the next active operation may increase as compared to known sense amplifiers not using negative voltages.

Figure 6:
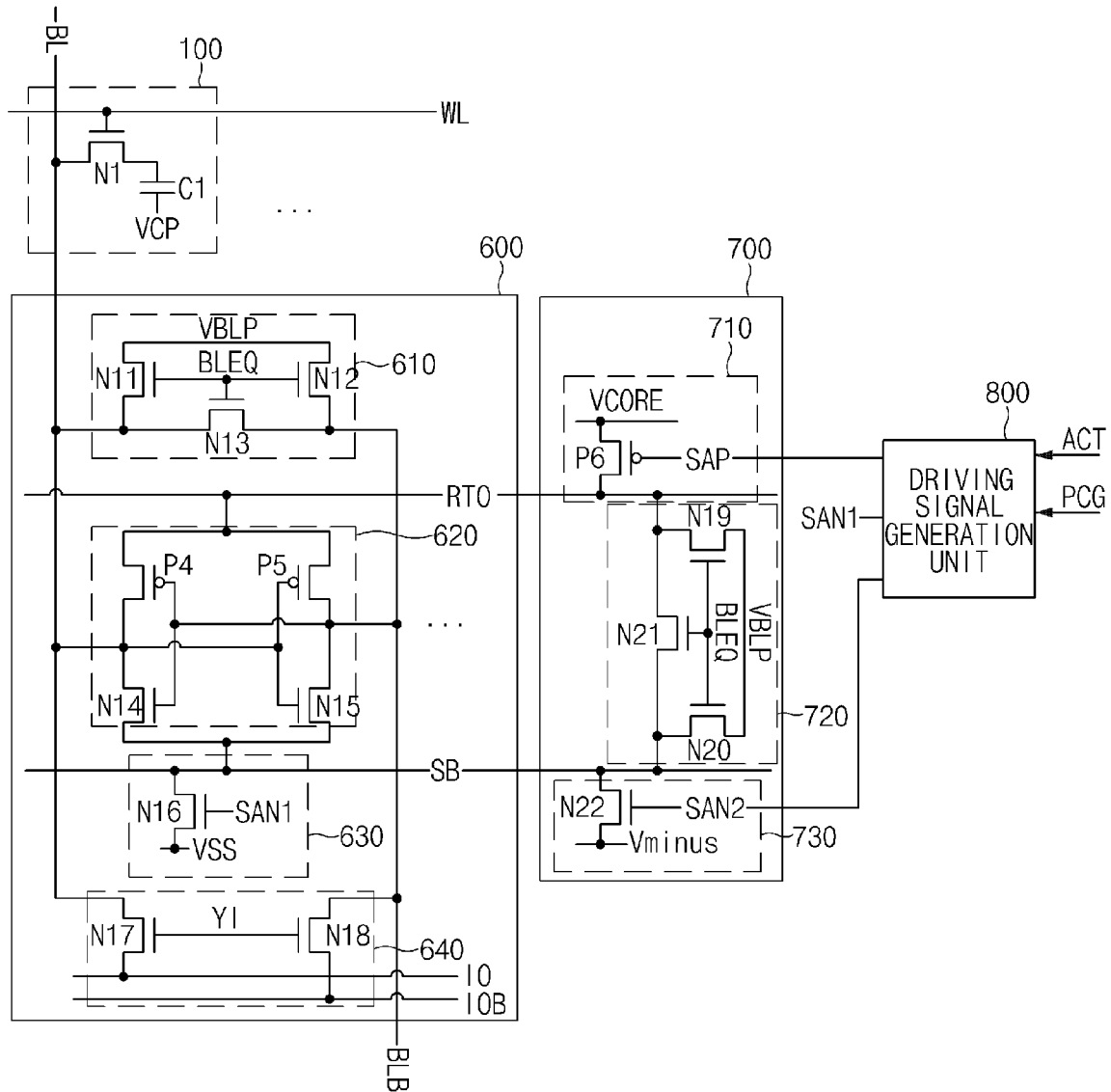
FIG. 6 is a configuration diagram illustrating an example of a semiconductor device in accordance with another embodiment.

FIG. 6 is a configuration diagram illustrating an example of a sense amplifier 600 and a sense amplifier control circuit in accordance with an embodiment. The sense amplifier control circuit may include a sense amplifier driving block 700 and a driving signal generation unit 800.

The sense amplifier 600 according to an embodiment may include an equalization unit 610, an amplification unit 620, a pull-down unit 630, and a column selection unit 640.

The equalization unit 610 precharges a pair of bit lines BL and BLB to the level of a bit line precharge voltage VBLP in response to a bit line equalizing signal BLEQ.

The equalization unit 610 may include a plurality of NMOS transistors N11 to N13. The gate terminals of the plurality of NMOS transistors N11 to N13 are coupled in common to a terminal to which the bit line equalizing signal BLEQ is applied. The NMOS transistors N11 and N12 are coupled between a terminal to which the bit line precharge voltage VBLP is applied and the pair of bit lines BL and BLB, respectively. The source/drain terminals of the NMOS transistor N13 are coupled to the pair of bit lines BL and BLB, respectively.

The amplification unit 620 amplifies the data transmitted through the pair of bit lines BL and BLB in response to the voltages applied from a pull-up power line RTO and a pull-down power line SB. The amplification unit 620 may include PMOS transistors P4 and P5 and NMOS transistors N14 and N15 forming a latch structure. The gate terminals of the PMOS transistor P4 and the NMOS transistor N14 are coupled to the bit line bar BLB in common. The gate terminals of the PMOS transistor P5 and the NMOS transistor N15 are coupled to the bit line BL in common.

The pull-down unit 630 is controlled by a driving signal SAN1, and pulls the voltage level of the amplification unit 620 down to the level of a ground voltage VSS. The pull-down unit 630 may include an NMOS transistor N16 which is coupled between the amplification unit 620 and the application terminal of the ground voltage VSS, and may be applied with the driving signal SAN1 through the gate terminal thereof. The pull-down unit 630 is turned on if the driving signal SAN1 is enabled at a time when the amplification unit 620 operates, and supplies the ground voltage VSS to the amplification unit 620.

The column selection unit 640 selectively controls electrically coupling of the pair of bit lines BL and BLB and a pair of input/output lines IO and IOB in response to a column select signal YI. The column selection unit 640 may include NMOS transistors N17 and N18 which are coupled between the pair of bit lines BL and BLB and the pair of input/output lines IO and JOB, and may be applied with the column select signal YI through the common gate terminal thereof.

The sense amplifier driving block 700 may include a pull-up driving unit 710, a precharge unit 720, and a pull-down driving unit 730.

The pull-up driving unit 710 supplies a core voltage VCORE to the pull-up power line RTO in response to a pull-up driving signal SAP. The pull-up driving unit 710 may include a PMOS transistor P6 which is coupled between the pull-up power line RTO and a terminal to which the core voltage VCORE is applied, and may be applied with the pull-up driving signal SAP through the gate terminal thereof.

The precharge unit 720 precharges the pull-up power line RTO and the pull-down power line SB to the level of the bit line precharge voltage VBLP in response to the bit line equalizing signal BLEQ.

The precharge unit 720 may include a plurality of NMOS transistors N19 to N21. The gate terminals of the plurality of NMOS transistors N19 to N21 are coupled in common to a terminal to which the bit line equalizing signal BLEQ is applied. The NMOS transistors N19 and N20 are coupled between a terminal to which the bit line precharge voltage VBLP is applied and the pull-up power line RTO and the pull-down power line SB, respectively. The source/drain terminals of the NMOS transistor N21 are coupled to the pull-up power line RTO and the pull-down power line SB, respectively.

The pull-down driving unit 730 is controlled by a driving signal SAN2 and supplies a minus voltage Vminus to the pull-down power line SB. The pull-down driving unit 730 may include an NMOS transistor N22 which is coupled between the precharge unit 720 and a terminal to which the minus voltage Vminus is applied, and may be applied with the pull-down driving signal SAN2 through the gate terminal thereof.

The pull-down driving unit 730 is turned on at a time when the pull-down driving signal SAN2 is enabled, and supplies the minus voltage Vminus to the pull-down power line SB. The pull-down driving unit 730 is turned off at a time when the pull-down driving signal SAN2 is disabled.

In an embodiment, a layout for the pull-down unit 630 and pull-down driving unit 730 may be designed such that a direct current path is not formed between them. For example, the pull-down unit 630, which supplies the ground voltage VSS to the pull-down power line SB by the driving signal SAN1, is disposed in the region of the bit line sense amplifier 600, whereas the pull-down driving unit 730, which supplies the minus voltage Vminus to the pull-down power line SB, is positioned in the region of the sense amplifier driving block 700. Since a direct current path is not formed between the pull-down unit 630 and the sense amplifier driving block 700, a sense amplifier in accordance with an embodiment of the present invention may reduce noise.

The driving signal generation unit 800 generates the pull-up driving signal SAP and the pull-down driving signal SAN2 in response to an active signal ACT and a precharge signal PCG, and outputs the pull-up driving signal SAP and the pull-down driving signal SAN2 to the sense amplifier driving block 700.

Figure 7:
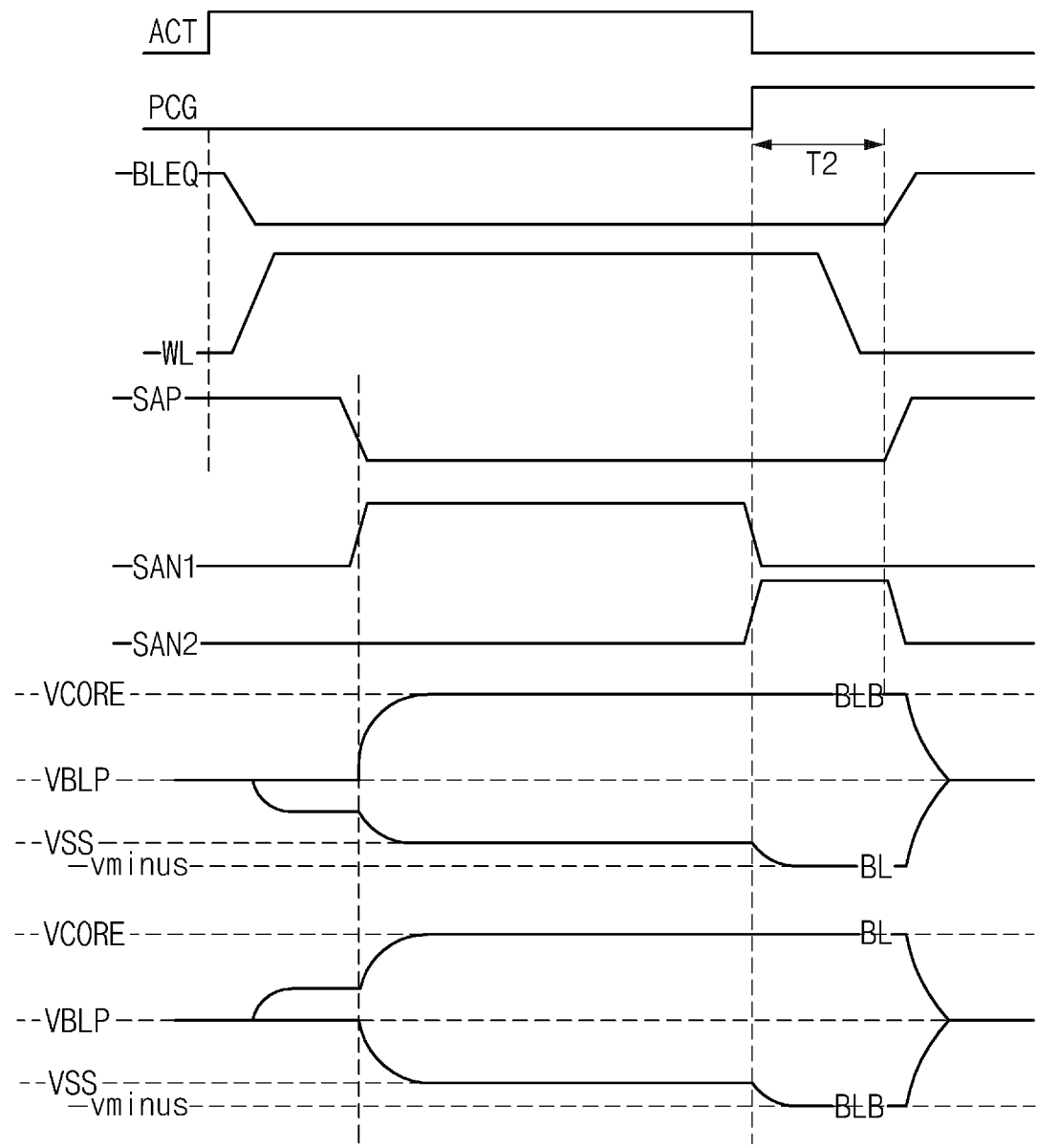
FIG. 7 is a timing diagram to explain the operation of the sense amplifier shown in FIG. 6.

FIG. 7 is a timing diagram to explain the operation process of the sense amplifier 600 and the sense amplifier driving block 700 shown in FIG. 6.

In the case where the active signal ACT is enabled to a high level, the signal of a word line WL transitions to a high level, and the bit line equalizing signal BLEQ becomes a low level. As a result, charge-sharing between the cell 100 and the bit line BL occurs, and the equalization unit 610 becomes a turned-off state.

In the case where the driving signal SAN1 is a low level, the sense amplifier 600 does not operate. In the case where the sense amplifier 600 is in a precharge state, the sense amplifier 600 precharges bit lines with the bit line precharge voltage VBLP. If the word line WL is enabled, the pair of bit lines BL and BLB start to develop due to the difference between the voltages applied to the pair of bit lines BL and BLB.

After a predetermined time is delayed from when the active signal ACT is enabled, the driving signal generation unit 800 enables the pull-up driving signal SAP to a low level and enables the driving signal SAN1 to a high level.

If the pull-up driving signal SAP is enabled to the low level, the pull-up driving unit 710 is turned on, and the core voltage VCORE is supplied to the pull-up power line RTO. If the driving signal SAN1 is enabled to the high level, the pull-down unit 630 is turned on, and the ground voltage VSS is supplied to the pull-down power line SB and the amplification unit 620 operates. In other words, the ground voltage VSS is supplied as a pull-down voltage to the amplification unit 620 during a period in which the driving signal SAN1 is the high level.

Thereafter, if the precharge signal PCG is enabled to a high level, the driving signal generation unit 800 disables the driving signal SAN1 to the low level and enables the pull-down driving signal SAN2 to a high level.

When the pull-down unit 630 is turned off, the ground voltage VSS is not supplied any more to the pull-down power line SB. The pull-down driving unit 730 is turned on, and the minus voltage Vminus is supplied to the pull-down power line SB during a period (e.g., a period T2) in which the pull-down driving signal SAN2 has the high level.

In an embodiment, during a specified period (e.g., the period T2) from the enable time of the precharge signal PCG, the sensing margin Delta V of the sense amplifier 600 may increase.

The pull-down driving unit 730 supplies the minus voltage Vminus to the pull-down power line SB during the specified period (e.g., the period T2) from when the precharge signal PCG is enabled to the high level to before the bit line equalizing signal BLEQ is enabled to a high level.

A time during which the pull-down driving signal SAN2 is enabled and the pull-down driving unit 730 supplies the minus voltage Vminus may be set as a delay time in the driving signal generation unit 800.

If the active signal ACT transitions to a low level, the signal of the word line WL transitions to a low level. When the NMOS transistor N1 of the cell 100 is turned off, the charges of the cell 100 are not transferred any more to the bit line BL.

If a predetermined delay time (e.g., the period T2) has passed after the precharge signal PCG is enabled to the high level, the bit line equalizing signal BLEQ transitions to the high level. When the equalization unit 610 is turned on, the pair of bit lines BL and BLB are equalized to the level of the bit line precharge voltage VBLP.

In the case where the bit line equalizing signal BLEQ is the high level, the precharge unit 720 is turned on, and the pull-up power line RTO and the pull-down power line SB are precharged to the level of the bit line precharge voltage VBLP.

If the pull-up driving signal SAP transitions to a high level, the pull-up driving unit 710 is turned off, and the amplification unit 620 does not operate. If the pull-down driving signal SAN2 transitions to a low level, the pull-down driving unit 730 is turned off, and the minus voltage Vminus is not supplied any more to the pull-down power line SB.

In an active operation mode, the core voltage VCORE is supplied to the pull-up power line RTO and the ground voltage VSS is supplied to the pull-down power line SB. In a precharge operation mode, the core voltage VCORE is supplied to the pull-up power line RTO and the minus voltage Vminus lower than the ground voltage VSS is supplied to the pull-down power line SB during the predetermined period (e.g., the period T2).

So far, various embodiments have been described in detail. For reference, embodiments including additional component elements, which are not directly associated with the technical spirit of the present invention, may be exemplified in order to describe the present inventive concept in further detail. Moreover, an active high configuration or an active low configuration for indicating the activated states of signals and circuits may vary depending upon an embodiment.

Furthermore, the configurations of transistors may be changed as the occasion demands in order to realize the same function. That is to say, the configurations of a PMOS transistor and an NMOS transistor may be replaced with each other, and as the occasion demands, various transistors may be employed. Since these circuit changes have a large number of cases and can be easily inferred by those skilled in the art, the enumeration thereof will be omitted herein.

While various embodiments have been described above, it will be understood to those skilled in the art that the embodiments described are by way of example only. Accordingly, the sense amplifier and the semiconductor device including the same described herein should not be limited based on the described embodiments.

What is claimed is:

1. A sense amplifier comprising:
    an equalization unit configured to precharge a pair of bit lines to a level of a bit line precharge voltage in response to a bit line equalizing signal;
    an amplification unit configured to sense and amplify voltages of the pair of bit lines, supply, during an active operation, a ground voltage to a pull-down node of a latch section, and supply, a first voltage lower than the ground voltage to the pull-down node of the latch section during a period from a point of time when a precharge signal is enabled to before the bit line equalizing signal is enabled; and a driving signal control circuit configured to disable the bit line equalizing signal and enable a word line when an active signal is enabled, enable a first driving signal after a predetermined delay time when the active signal is enabled, and disable the first driving signal and enable a second driving signal when the precharge signal is enabled, wherein the driving signal control circuit comprises:

a bank control block configured to generate an inverted signal of the bit line equalizing signal, a pull-up driving signal, a first pull-down driving signal and a second pull-down driving signal in response to the active signal and the precharge signal; and a sense amplifier driving block configured to drive the inverted signal of the bit line equalizing signal, the pull-up driving signal, the first pull-down driving signal and the second pull-down driving signal, and output the bit line precharge signal, the first driving signal and the second driving signal, wherein the bank control block comprises:

a command control unit configured to output the active signal and the precharge signal in response to a bank control signal;

a first delay unit configured to delay the active signal;

a second delay unit configured to delay the precharge signal;

a driving signal generation unit configured to generate the inverted signal of the bit line equalizing signal in response to the active signal and an output of the second delay unit;

a pull-up control unit configured to generate the pull-up driving signal in response to the output of the second delay unit and an output of the first delay unit;

a first pull-down control unit configured to drive the output of the first delay unit and the precharge signal; and a second pull-down control unit configured to control the first pull-down driving signal and the second pull-down driving signal in response to the output of the second delay unit and an output of the first pull-down control unit.

2. The sense amplifier according to claim 1, wherein the first voltage is a minus voltage.

3. The sense amplifier according to claim 1, wherein the amplification unit comprises:

a latch section configured to sense and amplify the voltages of the pair of bit lines;

a first pull-down section configured to supply the ground voltage to the latch section in response to a first driving signal;

a second pull-down section configured to supply the first voltage to the latch section in response to a second driving signal; and a pull-up section configured to selectively supply a core voltage to the latch section in response to a third driving signal.

4. The sense amplifier according to claim 3, wherein the first pull-down section comprises a first NMOS transistor coupled between the pull-down node of the latch section and a terminal to which the ground voltage is applied, and wherein the NMOS transistor is driven by the first driving signal.

5. The sense amplifier according to claim 3, wherein the second pull-down section comprises a second NMOS transistor coupled between the pull-down node of the latch section and a terminal to which the first voltage is applied, and wherein the second NMOS transistor is driven by the second driving signal.

6. The sense amplifier according to claim 3, wherein the pull-up section comprises a PMOS transistor coupled between the latch section and a terminal to which the core voltage is applied, and wherein the PMOS transistor is driven by the third driving signal.

7. The sense amplifier according to claim 3, wherein, when an active signal is enabled in the active operation, the pull-up section is enabled after a predetermined delay time has passed.

8. The sense amplifier according to claim 3, wherein, when an active signal is enabled in the active operation, the first pull-down section is enabled after the predetermined delay time has passed.

9. The sense amplifier according to claim 3, wherein, when the precharge signal is enabled, the first pull-down section is disabled and the second pull-down section is enabled.

10. The sense amplifier according to claim 3, wherein the second pull-down section retains an enabled state during a period from a point of time when the precharge signal is enabled to before the bit line equalizing signal is enabled.

11. The sense amplifier according to claim 3, wherein the pull-up section retains an enabled state during a period in which the first pull-down section and the second pull-down section operate.

12. The sense amplifier according to claim 1, wherein the sense amplifier driving block is formed in a repeater region.

13. A semiconductor device comprising:

a sense amplifier configured to precharge a pair of bit lines to a level of a bit line precharge voltage in response to a bit line equalizing signal, and sense and amplify data of the pair of bit lines in response to driving voltages applied to a pull-up power line and a pull-down power line; and a sense amplifier control circuit configured to supply a core voltage to the pull-up power line in response to a pull-up driving signal, and supply a minus voltage lower than a ground voltage to the pull-down power line in response to a pull-down driving signal during a period from a point of time when a precharge signal is enabled to before the bit line equalizing signal is enabled, wherein the sense amplifier control circuit comprises:

a driving signal generation unit configured to generate the pull-up driving signal and the pull-down driving signal in response to an active signal and the precharge signal; and a sense amplifier driving block configured to supply the core voltage to the pull-up power line in response to the pull-up driving signal, and supply the minus voltage to the pull-down power line in response to the pull-down driving signal, wherein, after a predetermined delay time from when an active signal is enabled, the pull-up driving signal and a driving signal are enabled, and the ground voltage is supplied to the pull-down power line for a predetermined time, and wherein, when the precharge signal is enabled, the driving signal is disabled and the pull-down driving signal is enabled, and the minus voltage is supplied to the pull-down power line until the bit line equalizing signal is enabled.

14. The semiconductor device according to claim 13, wherein the sense amplifier comprises:
   an equalization unit configured to precharge the pair of bit lines to the level of the bit line precharge voltage in response to the bit line equalizing signal;
   an amplification unit configured to sense and amplify voltages of the pair of bit lines in response to the driving voltages applied to the pull-up power line and the pull-down power line; and
   a pull-down unit configured to supply the ground voltage to the pull-down power line in response to the driving signal in an active operation.

15. The semiconductor device according to claim 13, wherein the sense amplifier driving block comprises:
   a pull-up driving unit configured to supply the core voltage to the pull-up power line in response to the pull-up driving signal;
   a precharge unit configured to precharge the pull-up power line and the pull-down power line in response to the bit line equalizing signal; and
   a pull-down driving unit configured to supply the minus voltage to the pull-down power line in response to the pull-down driving signal.

* * * * *